(12) United States Patent
Lei et al.

(10) Patent No.: US 7,985,658 B2
(45) Date of Patent: Jul. 26, 2011

(54) METHOD OF FORMING SUBSTRATE FOR USE IN IMAGER DEVICES

(75) Inventors: Xinya Lei, Sunnyvale, CA (US);
Xiaofeng Fan, San Jose, CA (US);
Richard A. Mauritzson, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 276 days.

(21) Appl. No.: 12/480,440

(22) Filed: Jun. 8, 2009

(65) Prior Publication Data

US 2010/0311201 A1 Dec. 9, 2010

(51) Int. Cl.
*H01L 21/30* (2006.01)

(52) U.S. Cl. ............... 438/455; 438/459; 257/E21.122

(58) Field of Classification Search .......... 438/455–459; 257/E21.122
See application file for complete search history.

(56) References Cited

U.S. PATENT DOCUMENTS

| | | | |
|---|---|---|---|
| 5,773,355 A * | 6/1998 | Inoue et al. ................. | 438/459 |
| 5,940,685 A | 8/1999 | Loomis et al. | |
| 6,867,495 B2 * | 3/2005 | Czagas et al. ............... | 257/760 |
| 7,195,987 B2 * | 3/2007 | Bae et al. .................... | 438/406 |
| 2004/0014299 A1 * | 1/2004 | Moriceau et al. ........... | 438/459 |
| 2007/0176238 A1 | 8/2007 | Seacrist | |
| 2008/0017946 A1 | 1/2008 | Cazaux et al. | |
| 2008/0224247 A1 | 9/2008 | Hsu et al. | |

* cited by examiner

*Primary Examiner* — Brook Kebede

(57) ABSTRACT

A method of fabricating a semiconductor substrate structure comprises forming an oxide region in contact with a first semiconductor, e.g. silicon, substrate, implanting P-type dopants into the first semiconductor substrate to form a P-doped region, bonding the oxide region to a second semiconductor, e.g. silicon, substrate, and removing a portion of the first semiconductor substrate before or after implanting.

18 Claims, 12 Drawing Sheets

METHOD OF FORMING SUBSTRATE FOR USE IN IMAGER DEVICES

FIELD OF THE INVENTION

Embodiments described herein relate generally to the field of solid state imager devices. In particular, the embodiments relate to improving the performance of backside illuminated imager devices.

BACKGROUND OF THE INVENTION

There are a number of different types of semiconductor-based imager devices, including those employing charge coupled devices (CCDs), charge injection devices (CIDs), hybrid focal plane arrays, and complementary mental oxide semiconductor (CMOS) pixel arrays. Current applications of solid-state imager devices include cameras, scanners, machine vision systems, vehicle navigation systems, video telephones, computer input devices, surveillance systems, automatic focus systems, star trackers, motion detector systems, image stabilization systems, and other image acquisition and processing systems.

Imager devices are typically formed with an array of pixels each containing a photosensor, such as a photogate, phototransistor, photoconductor, or photodiode. The photosensor in each pixel absorbs incident radiation of a particular wavelength (e.g., optical photons or x-rays) and produces an electrical signal corresponding to the intensity of light impinging on that pixel when an optical image is focused on the pixel array. For example, the magnitude of the electrical signal produced by each pixel can be proportional to the amount of incident light captured. The electrical signals from all pixels are then processed to provide information about the captured optical image for storage, printing, transmission, display, or other usage.

Imager devices can be constructed so that incident light impinges on the frontside or alternatively the backside of the imager devices. For example, a backside illuminated imager device receives incident radiation through a backside of the device substrate, over which the imager device circuitry is formed.

Semiconductor-based imager devices, including those employing backside illumination, may have a P+ region that acts to getter or trap metal atoms or other contaminants entering into an imager device during fabrication. As metal atoms or contaminants migrate through the substrates of the imager device, they may become trapped, i.e. gettered, in the P+ region, where their effect on the pixel active circuitry and contribution to dark current is minimized. This provides a benefit over an imager device using an n-type substrate because n-type substrates are not as effective at gettering metallics and other contaminants; therefore, metals and other contaminants may migrate throughout the imager device and become lodged in the area of the substrate where the active devices and photo-sensitive devices are formed, and where they may contribute to the generation of dark current.

Imaging devices employing backside illumination typically utilize photo-diodes with depletion regions that extend to the backside surface for collection of electrons generated from shorter wavelengths of light (i.e., blue light), and improved quantum efficiency. However, the backside surface is prone to undesirable dark current electron generation due to silicon damage and surface states. A P+ region is desired along the backside surface to suppress and recombine these dark current generated electrons. If the P+ region along the backside surface becomes too thick it will degrade the photo-diode collection efficiency of shorter "blue" wavelengths (due to the photo-diode depletion region being pushed further away from the backside silicon surface).

The P+ surface along the backside surface may be formed by a p-type implant and activation step (e.g., laser anneal) post-silicon processing, or it can be formed prior to silicon processing during manufacture of a silicon on insulator (SOI) substrate—usually as a predefined P+ seed layer prior to EPI silicon growth in a SOI substrate. The formation of the P+ layer using the implant approach can damage the silicon surface resulting in higher levels of dark current or yield loss. Additionally, the predefined P+ seed layer thickness can be limited by the SOI manufacturing technology, and typically is too thick resulting in degradation of photosensor efficiency. FIGS. 1A-1D illustrate existing art and method of forming an SOI substrate with P+ seed layer (104).

Fabrication of a P+ region that mitigates the thick P+ region without using an implant and anneal process is desirable.

DETAILED DESCRIPTION OF THE INVENTION

In the following detailed description, reference is made to certain embodiments. These embodiments are described with sufficient detail to enable those skilled in the art to practice them. It is to be understood that other embodiments may be employed, and that various structural, logical, and electrical changes may be made.

Embodiments described herein provide methods of fabricating a wafer having a very thin P+ region using a P-type implant process, and the resulting structures. The methods create a wafer with a thin P+ region, having a thickness less than or equal to 2000 Å, without the need for an implant and anneal post-silicon process that can result in silicon surface damage and added costs. The resulting wafer is particularly suitable for pixel arrays of imager devices, e.g. CMOS pixel arrays.

Referring to FIGS. 2A-2D, one embodiment is now described with reference to the fabrication of a wafer for use in imager device fabrication, wherein like reference numbers are used consistently for like features throughout the drawings.

Figure 1A:
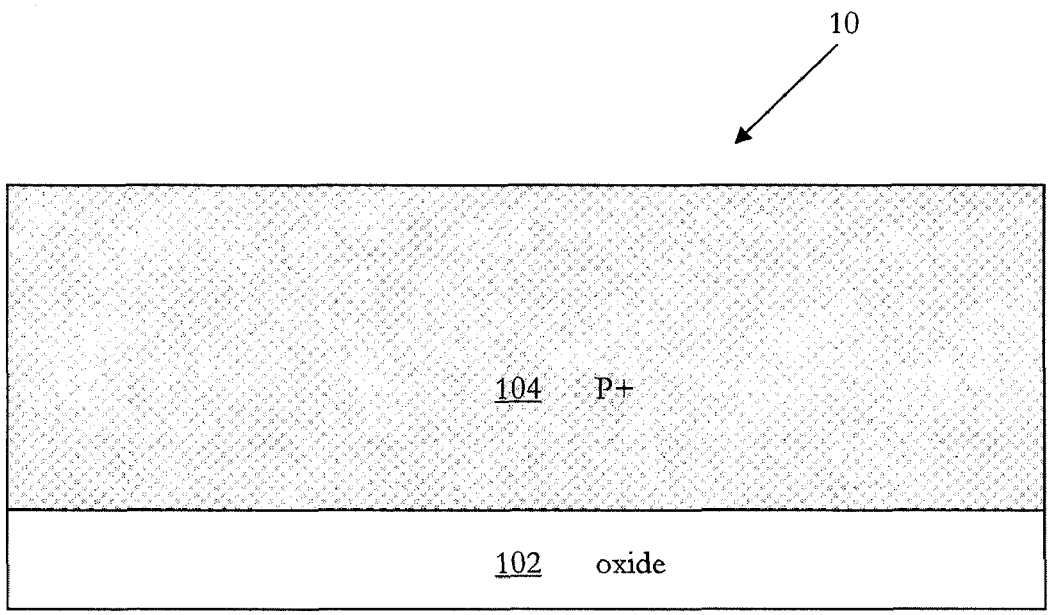
FIGS. 1A-1D illustrate a conventional method of forming a P+ region.
Figure 1B:
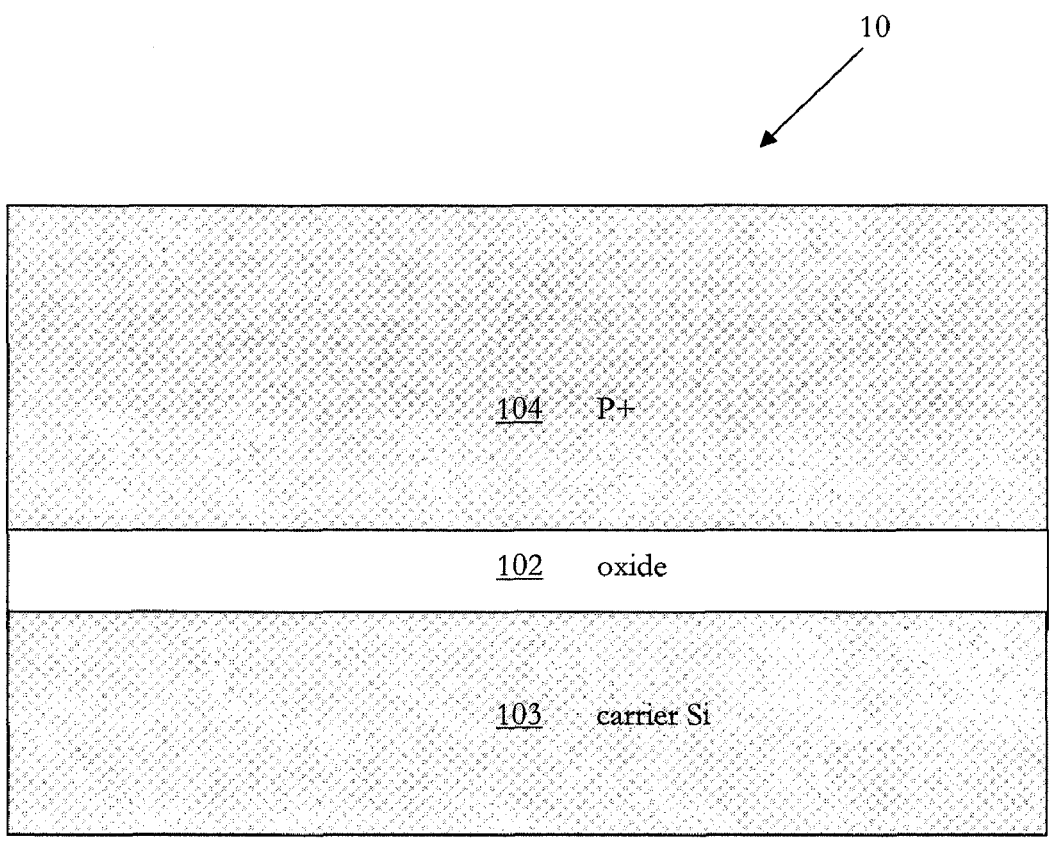
Figure 1C:
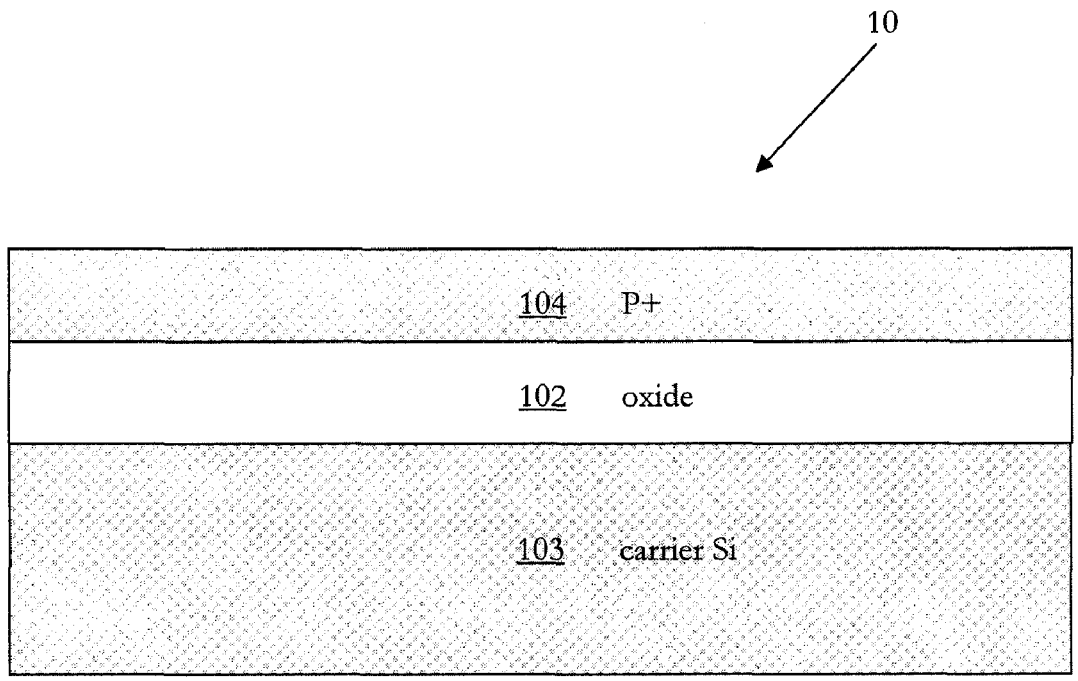
Figure 1D:
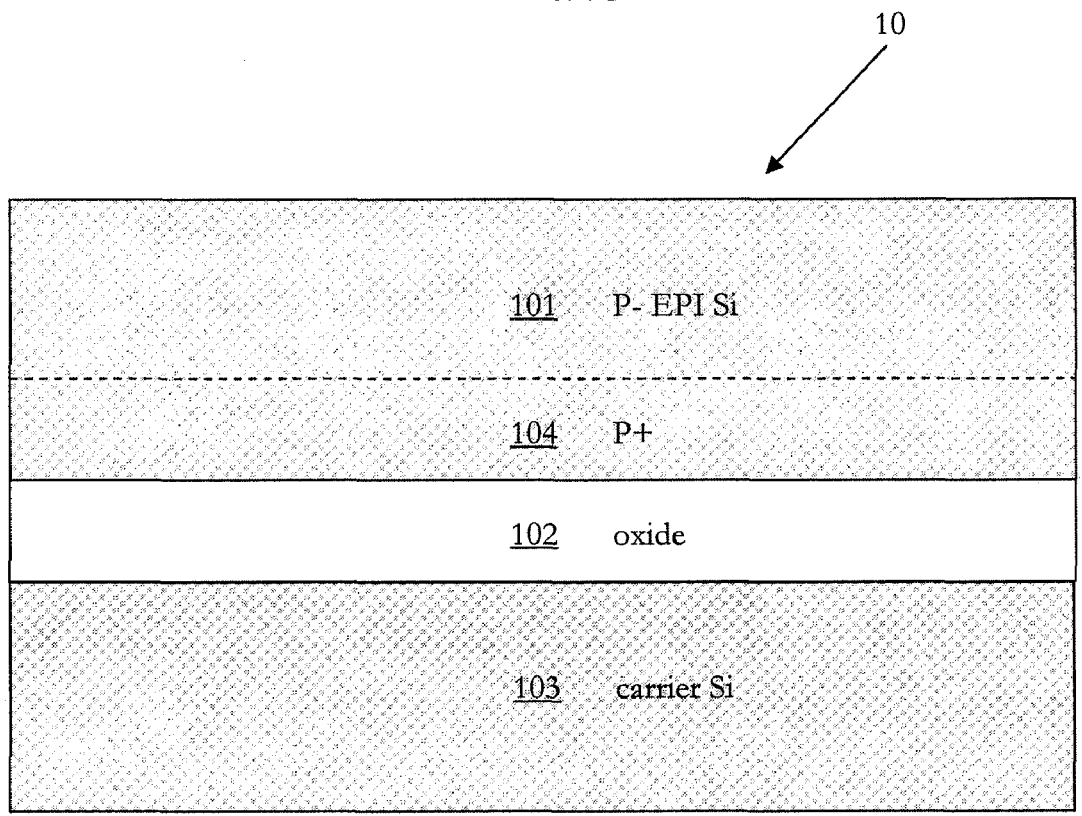
Figure 2A:
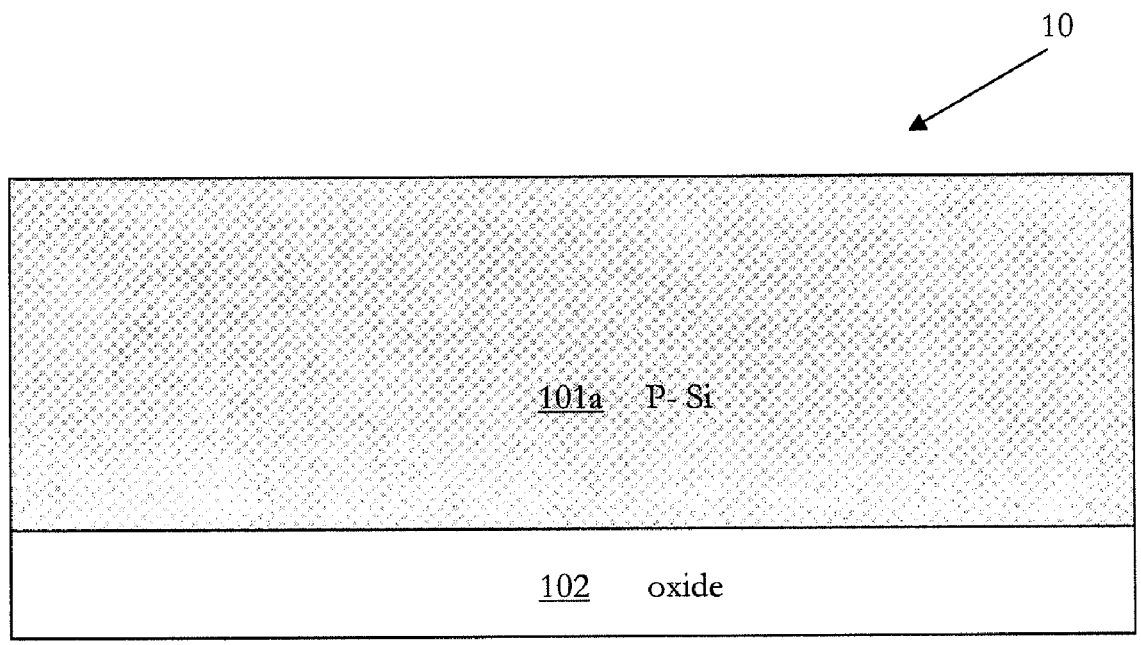
FIGS. 2A-2D illustrate the formation of a P+ region in accordance with an embodiment described herein.

As shown in FIG. 2A, the method begins with a wafer 10 having a P− silicon substrate 101*a* over an oxide region 102. Region 102 may comprise thermally grown oxide for better silicon surface quality. There is no restriction on the oxide thickness as long as a later formed P+ region can be well defined by implant through the oxide.

Figure 2B:
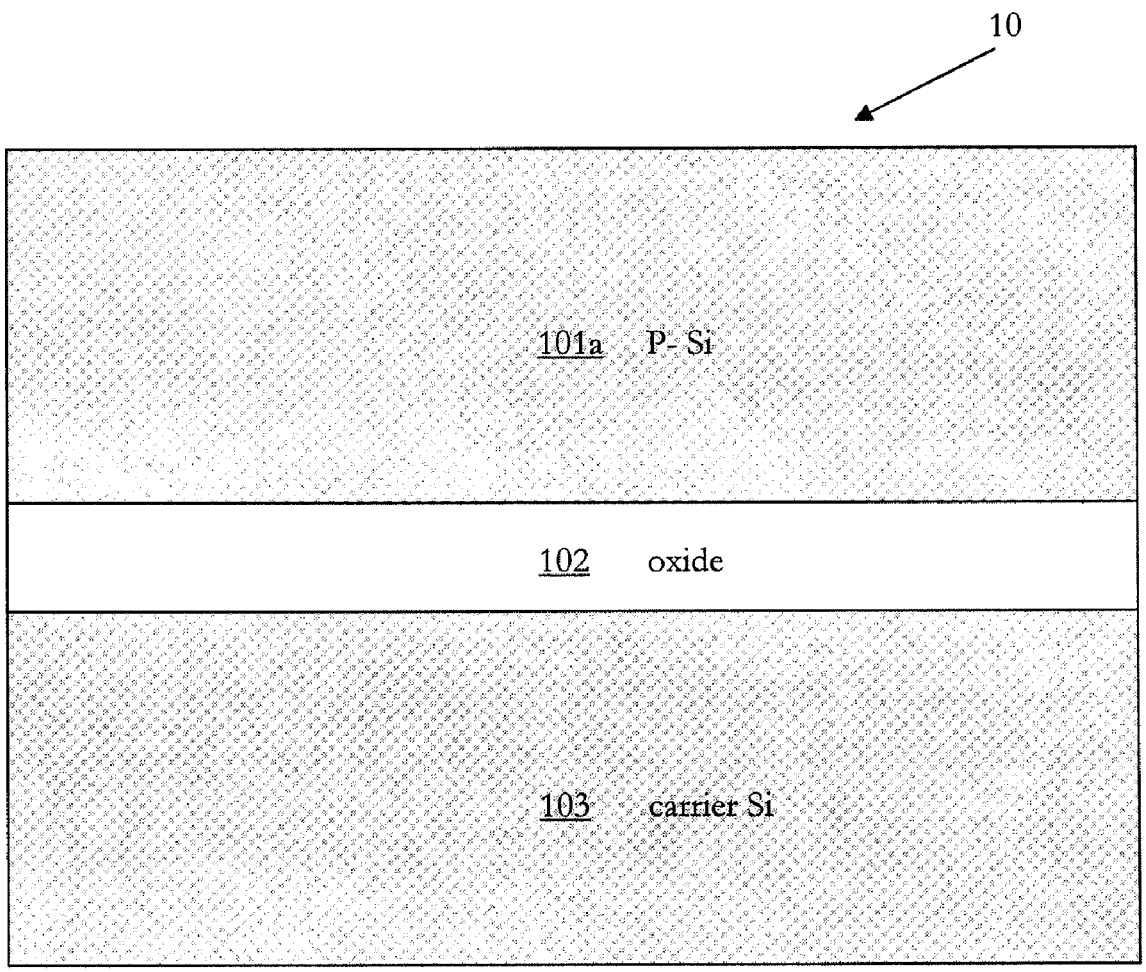
Figure 2C:
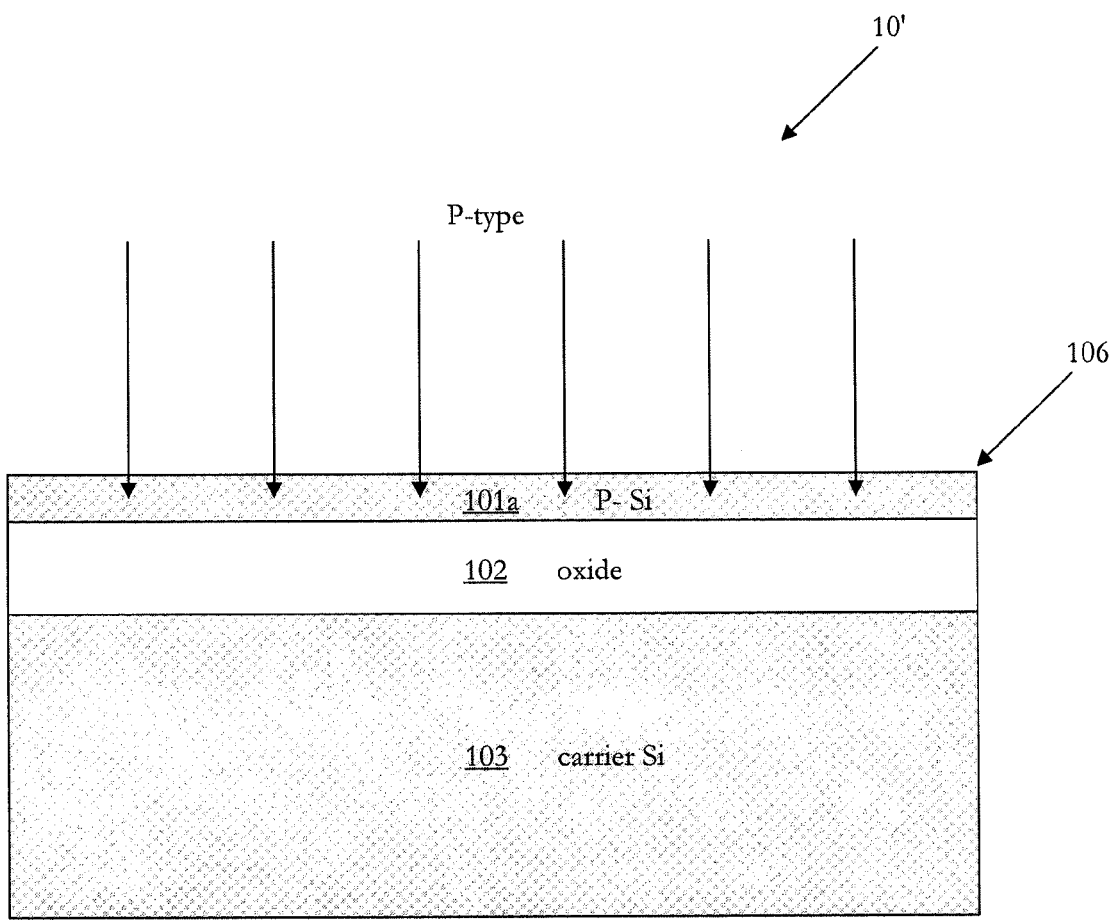
Figure 2D:
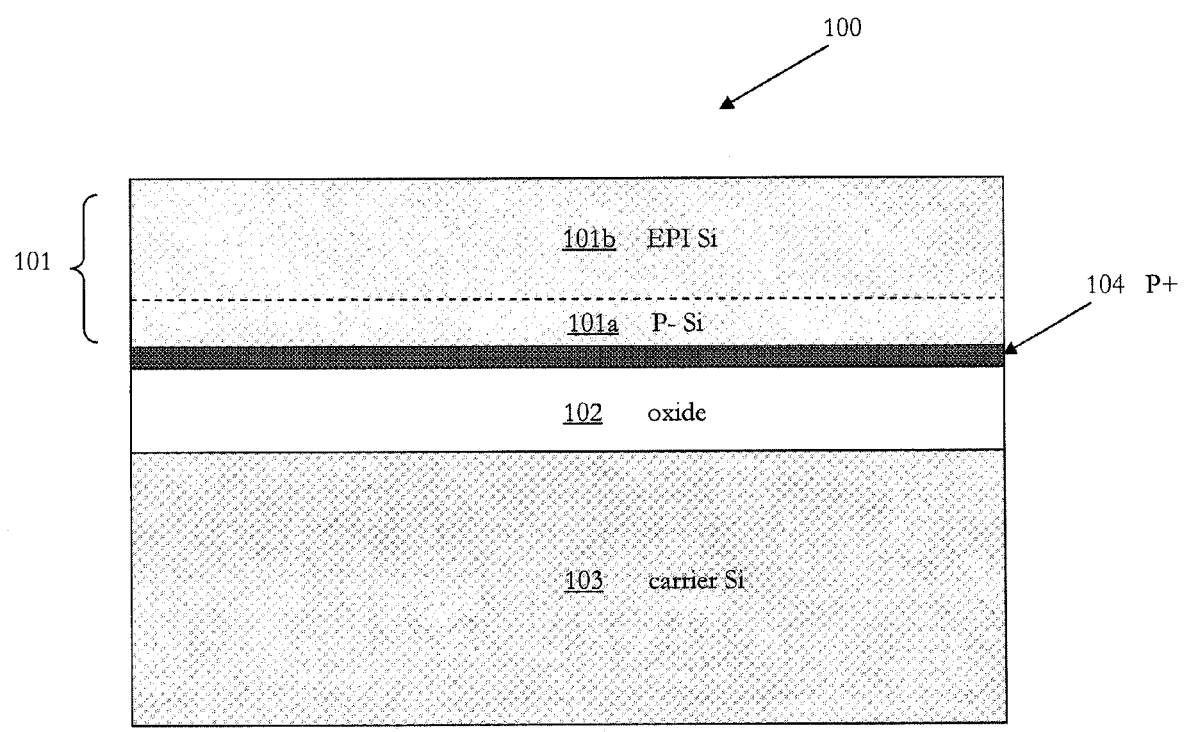

The wafer 10 is then bonded by any conventional method to a carrier silicon wafer 103 so that the oxide region 102 is between the two layers of silicon as shown in FIG. 2B. Then, as depicted in FIG. 2C, a portion of the silicon substrate 101*a* is removed by any known process (e.g., mechanical polishing and/or chemical etching) creating modified wafer 10'. A P-type implant is conducted on the side 106 of the substrate 101*a* to create a thin (100 Å-2000 Å) P+ region 104 as shown in FIG. 2D. The implant is performed with, for example, Boron or $BF_2$ ions with energies below 100 keV, or any other P-type dopant. An epitaxial layer of silicon 101*b* is then grown on the silicon substrate 101*a* implanted with P+ region 104, to achieve the wafer 100 structure shown in FIG. 2D.

Figure 3A:
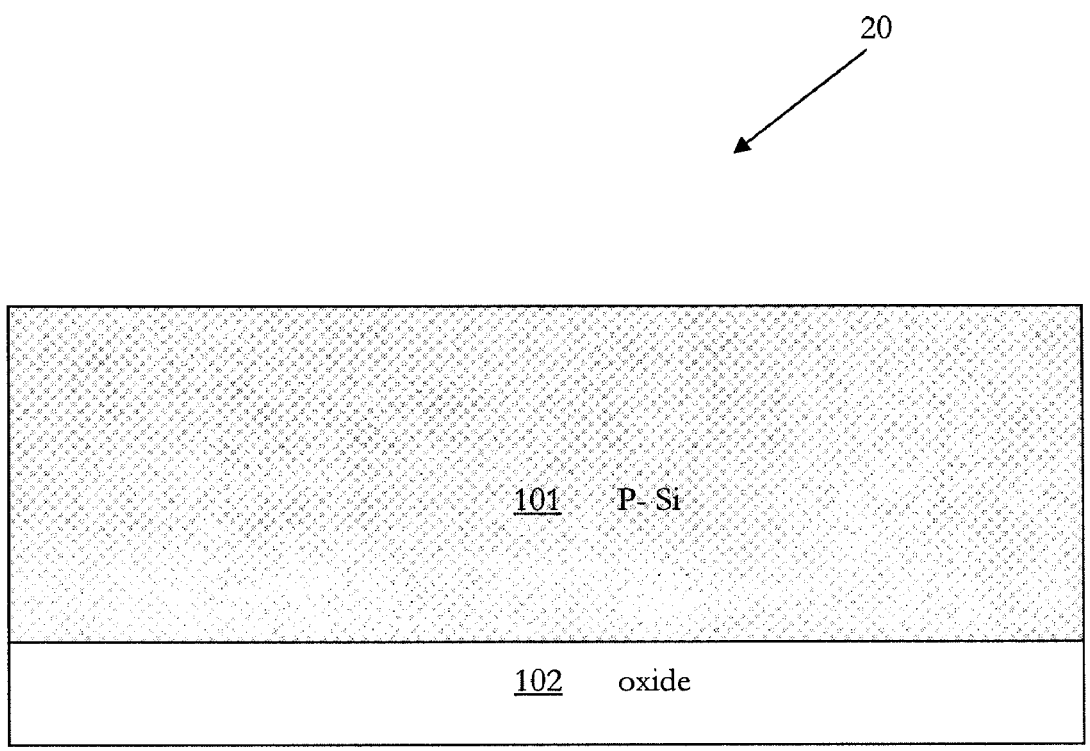
FIGS. 3A-3D illustrate the formation of a P+ region in accordance with another embodiment described herein.
Figure 3B:
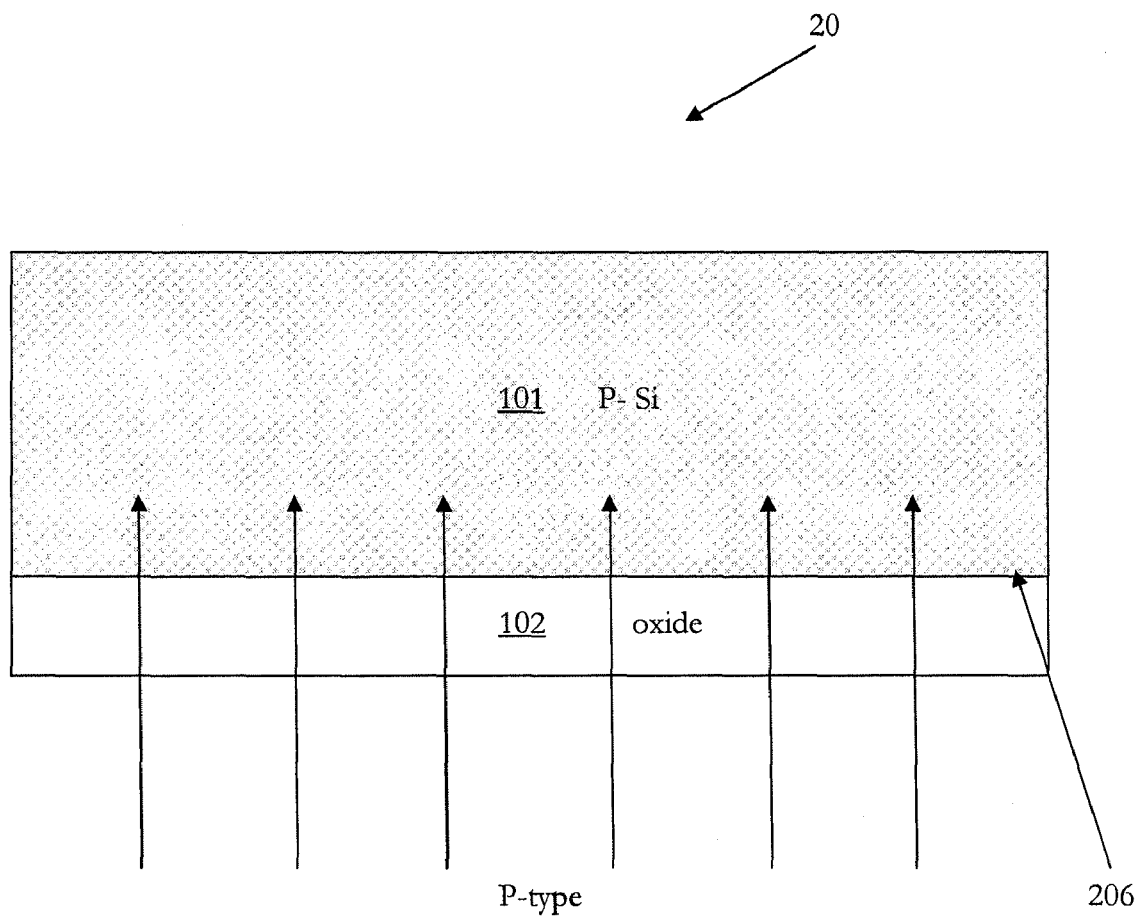
Figure 3C:
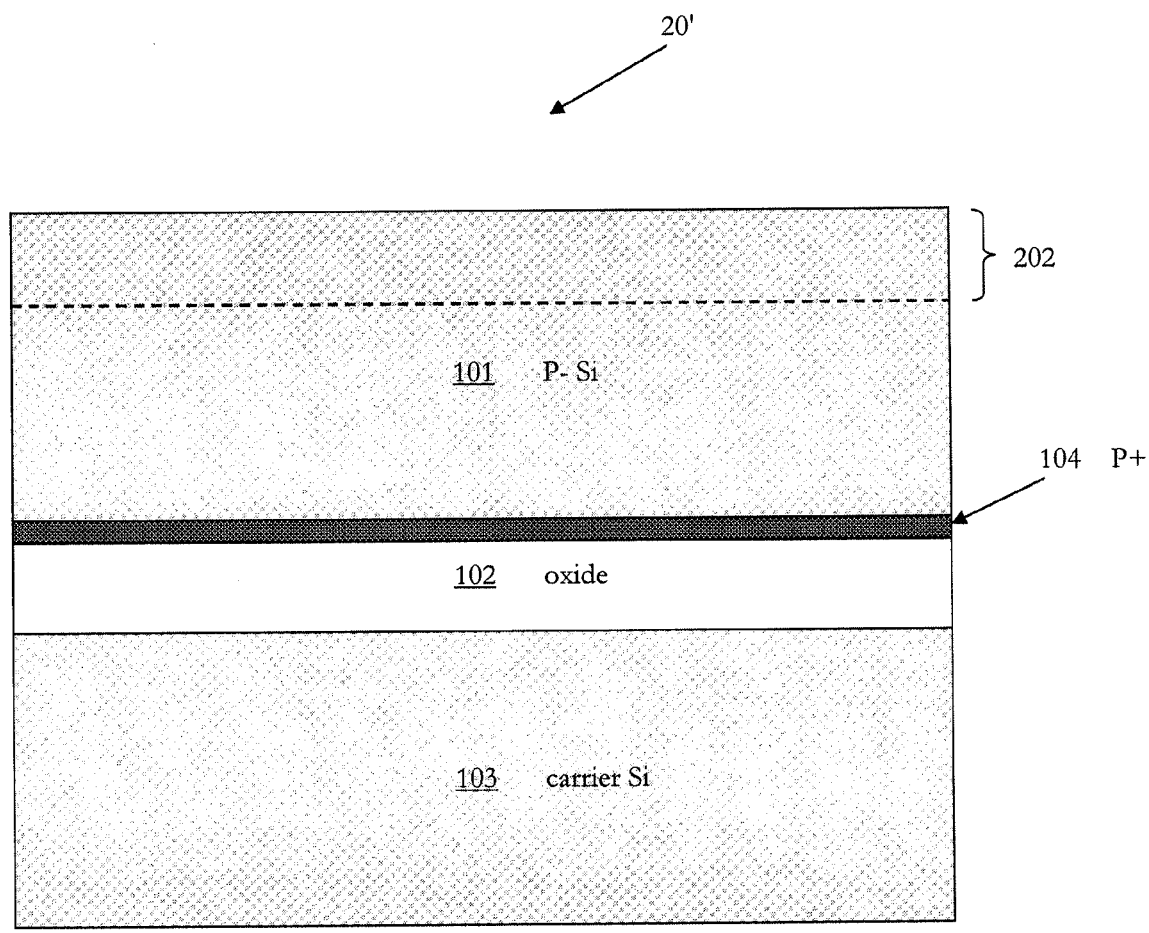
Figure 3D:
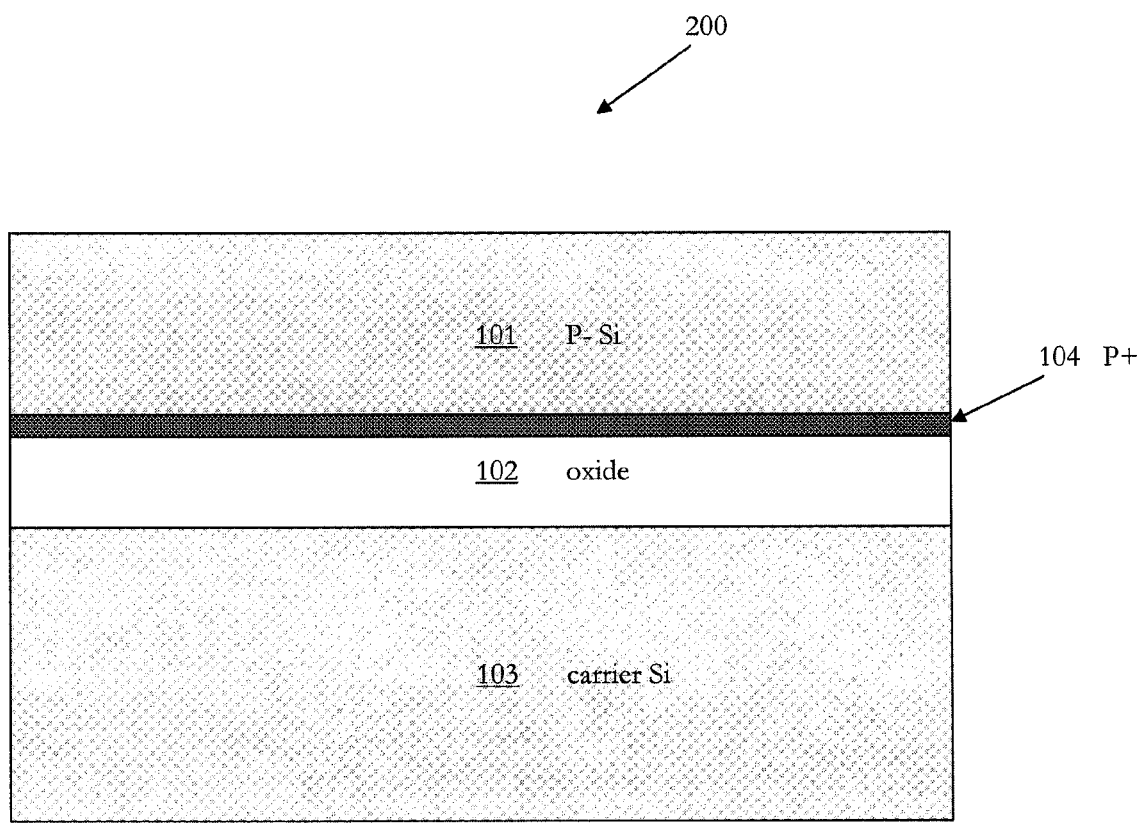

Referring to FIGS. 3A-3D, another embodiment is now described. As shown in FIG. 3A, the method begins with a wafer 20 having a P– silicon substrate 101 and an oxide region 102. The silicon substrate 101 may consist of crystalline silicon or a combination of crystalline and EPI silicon. As shown in FIG. 3B, a P-type implant is conducted through the oxide region 102 to side 206 of the silicon substrate 101 to create wafer 20' with a thin P+ region 104 (FIG. 3C). Then, the wafer 20' is bonded with a carrier silicon wafer 103 so that the oxide region 102 is between two layers of silicon as shown in FIG. 3C. Then, a portion 202 of the silicon substrate 101 is removed by any known process (e.g., mechanical polishing and/or chemical etching) to achieve the wafer 200 structure shown in FIG. 3D.

Surface P-type dopant concentration is chosen relative to the dopant level of a photodiode which is later formed in substrate 101 so that the depletion edge can be pushed away from the surface of substrate 101. The dopant concentration of the thin P+ region 104 may range from about $1\times10^{17}$ to about $1\times10^{20}$ atoms per $cm^3$. The thin P+ region 104 illustrated in the embodiments is formed to a thickness of less than or equal to 2000 Å.

Figure 4:
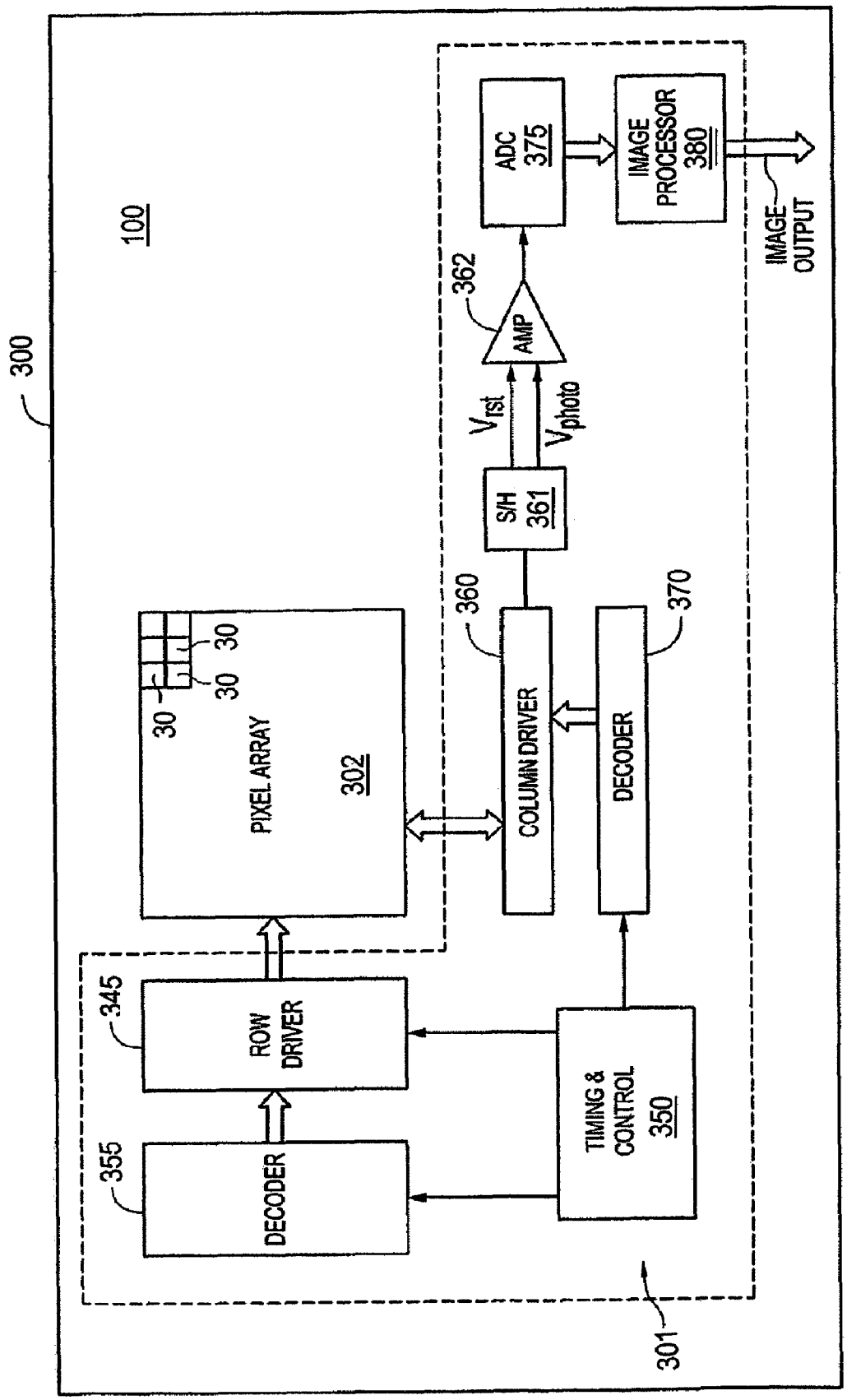
FIG. 4 is a block diagram of an image sensor according to any of the embodiments described herein.

FIG. 4 illustrates an image sensor 300 having an array of imaging pixels and associated image acquisition and processing circuit that can be formed on the surface of substrate 101 of wafer 100. Alternatively, it could be formed on the surface of substrate 101 of wafer 200. The term "pixel" refers to a photo-element unit cell containing a charge accumulating photo-conversion device and associated transistors for converting electromagnetic radiation to an electrical signal. The pixels discussed herein are illustrated and described as 4T (4 transistors) CMOS pixel circuits for the sake of example only. It should be understood that the embodiment is not limited to a four transistor (4T) pixel or even to CMOS technology, but may be used with other pixel arrangements having fewer (e.g., 3T) or more (e.g., 5T) than four transistors and other imager technology, for example, charge coupled devices (CCD). Although the embodiment is described herein with reference to the architecture and fabrication of one pixel, it should be understood that this is representative of a plurality of pixels as typically would be arranged in an imager array having pixels arranged, for example, in rows and columns. The following detailed description is, therefore, not to be taken in a limiting sense, and the scope of the present invention is defined only by the appended claims.

Additionally, while example embodiments are described in connection with image sensors, the claimed invention is not so limited. The embodiments are applicable to other integrated circuit devices and systems, which might employ p and n-type gate structures.

FIG. 4 is a block diagram of a CMOS image sensor 300 that employs structures formed in accordance with an example embodiment. The image sensor 300 includes peripheral circuitry 301 and a pixel array 302, which includes a plurality of pixels 30. The peripheral circuitry 301 can be included on the same wafer 100 as the pixel array 302. The wafer may a wafer formed by any embodiment described herein.

The peripheral circuitry 301 includes, for example, a row driver 345 and row address decoder 355. Row lines of the array 302 are selectively activated by the row driver 345 in response to row address decoder 355. A column driver 360 and column address decoder 370 are also included in the peripheral circuitry 301. The image sensor 300 is operated by the timing and control circuit 350, which controls the address decoders 355, 370. The control circuit 350 also controls the row and column driver circuitry 345, 360.

A sample and hold circuit 361 associated with the column driver 360 reads a pixel reset signal Vrst and a pixel image signal Vsig for selected pixels of the array 302. A differential signal (Vrst-Vsig) is produced by differential amplifier 362 for each pixel and is digitized by analog-to-digital converter 375 (ADC). The analog-to-digital converter 375 supplies the digitized pixel signals to an image processor 380 which forms and may output a digital image.

As described above, the peripheral circuitry 301 includes digital circuitry, e.g., image processor 380, and analog circuitry, e.g., sample and hold circuit 361 and amplifier 362. Digital circuitry of the image sensor 300 includes PMOS and NMOS surface channel devices and analog circuitry includes buried channel PMOS devices. Additionally, the image sensor 300 includes transistors having both p-type and n-type gates.

Figure 5:
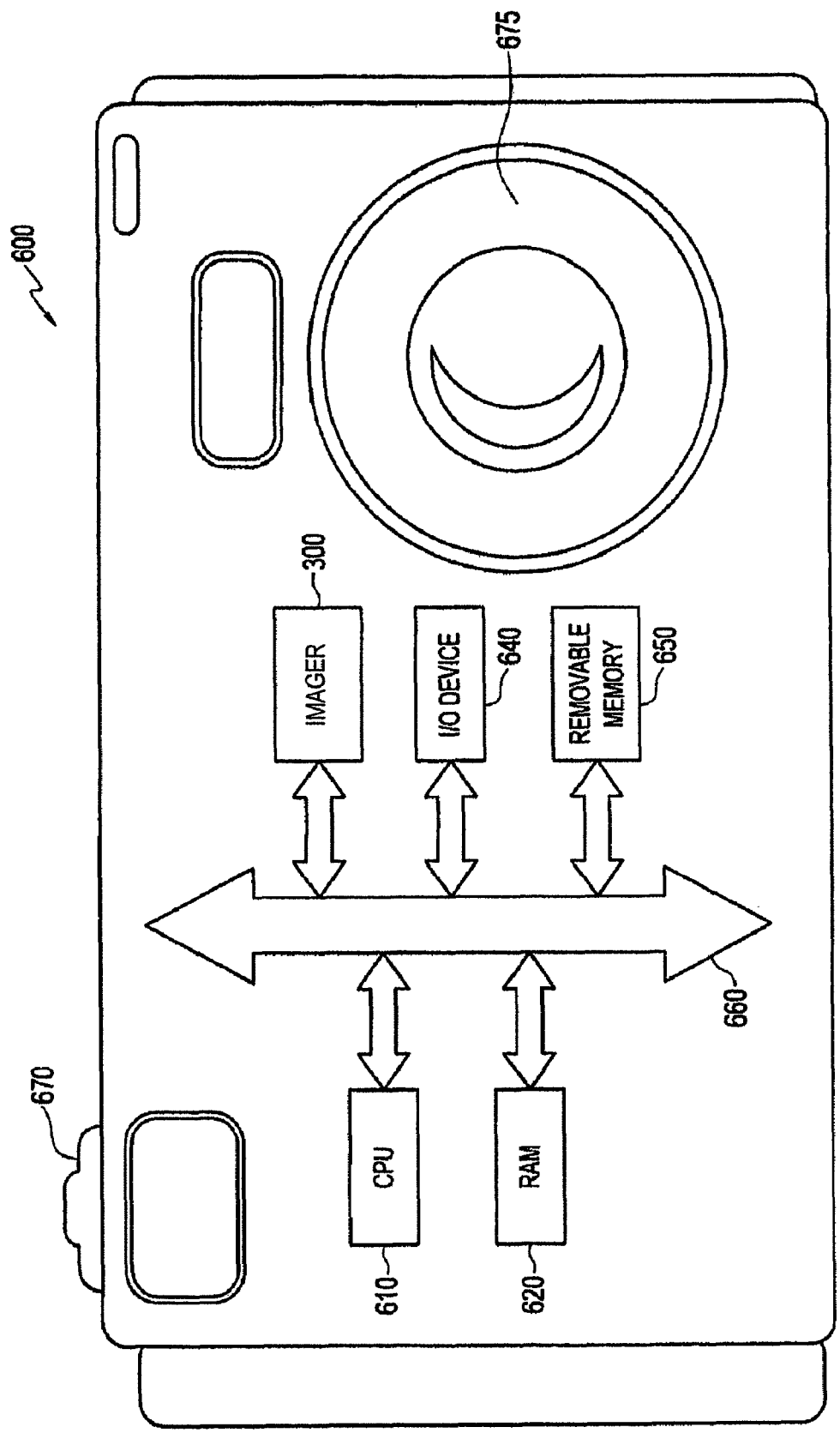
FIG. 5 illustrates a system which may be used with any of the embodiments described herein.

FIG. 5 shows a system 600, for example, a digital camera system, which includes the imager 300 of FIG. 4. The system 600 is an example of a system having digital circuits that could include imager devices. Without being limiting, in addition to a digital camera system, such a system could include a computer system, scanner, machine vision system, vehicle navigation system, video telephone, surveillance system, automatic focus system, star tracker system, motion detection system, image stabilization system, and other processing systems employing an imager 300.

System 600 generally comprises a central processing unit (CPU) 610, such as a microprocessor, that communicates with an input/output (I/O) device 640 over a bus 660. Imager 300 also communicates with the CPU 610 over the bus 660. The system 600 also includes random access memory (RAM) 620, and can include removable memory 650, such as flash memory, which also communicate with the CPU 610 over the bus 660. Imager 300 may be combined with a processor, such as a CPU 610, digital signal processor, or microprocessor, in a single integrated circuit. In a camera application, a shutter release button 670 is used to operate a mechanical or electronic shutter to allow image light which passes through a lens 675 to be captured by the pixel array 302 of imager 300.

The above description and drawings are only to be considered illustrative of specific embodiments, which achieve the features and advantages described herein. Modifications and substitutions to specific process conditions can be made. The order of the steps in forming the P+ region is not limited to the embodiments as described with respect to FIGS. 2A-2D and 3A-3D, and can be completed in any order except where a subsequent step requires a preceding step. Accordingly, the embodiments are not considered as being limited by the foregoing description and drawings, but is only limited by the scope of the appended claims.

We claim:
1. A method of forming a semiconductor substrate structure comprising:
   forming an oxide region in contact with a first semiconductor substrate;
   implanting P-type dopants into the first semiconductor substrate in a region adjacent the oxide region to form a P-doped region adjacent the oxide region;
   bonding the oxide region to a second semiconductor substrate; and
   removing a portion of the first semiconductor substrate.

2. A method as in claim 1, wherein the first and second substrates are silicon substrates.

3. The method of claim 2 further comprising forming a region of an epitaxial silicon in contact with the P-doped region.

4. The method of claim 3, wherein the region of epitaxial silicon is formed after the P-doped region is formed.

5. The method of claim 4, wherein the P-type dopants are implanted from a side of the oxide region that is in contact with the first silicon substrate.

6. The method of claim 2, wherein the P-type dopants are implanted from a side of the oxide region that is not in contact with the first silicon substrate.

7. The method of claim 2, wherein the P-doped region has a doping concentration between about $1\times10^{17}$ and about $1\times10^{20}$ atoms per $cm^3$.

8. The method of claim 2, wherein implanting P-type dopants uses an energy level below 100 keV.

9. The method of claim 2, wherein the P-doped region has a thickness of less than or equal to 2000 Å.

10. The method of claim 2, wherein the oxide region is a thermally grown oxide.

11. The method of claim 2 further comprising forming a pixel array on the substrate structure.

12. A method of forming a substrate comprising:
    forming an oxide region in contact with a first silicon substrate;
    subsequently, bonding the oxide region to a second silicon substrate;
    subsequently, removing a portion of the first silicon substrate;
    subsequently, implanting P-type dopants into the first silicon substrate to form a P+ region; and
    subsequently, forming a region of epitaxial silicon in contact with the P+ region.

13. The method of claim 12, wherein the P+ region has a thickness which is less than or equal to 2000 Å.

14. A method of forming a substrate comprising:
    forming an oxide region in contact with a first silicon substrate;
    subsequently, implanting P-type dopants into the first silicon substrate to form a P+ region adjacent the oxide region;
    subsequently, bonding the oxide region with a second silicon substrate; and
    subsequently, removing a portion of the first silicon substrate.

15. The method of claim 14, wherein the P+ region has a thickness which is less than or equal to 2000 Å.

16. A method of forming an imager comprising:
    forming an oxide region in contact with a first semiconductor substrate;
    implanting P-type dopants into the first semiconductor substrate in a region adjacent the oxide region to form a P+ region adjacent the oxide region;
    bonding the oxide region to a second semiconductor substrate;
    removing a portion of the first semiconductor substrate; and
    forming a pixel array on a surface of the first semiconductor substrate.

17. The method of claim 16, wherein a portion of the first semiconductor substrate is removed prior to implanting.

18. The method of claim 16, wherein a portion of the first semiconductor substrate is removed after implanting.

* * * * *